United States Patent
Nam et al.

(10) Patent No.: US 7,033,955 B2
(45) Date of Patent: Apr. 25, 2006

(54) METHOD FOR FABRICATING A SEMICONDUCTOR DEVICE

(75) Inventors: Ki Won Nam, Gyeonggi-do (KR); Kyung Won Lee, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/134,464

(22) Filed: May 23, 2005

(65) Prior Publication Data

US 2005/0260863 A1    Nov. 24, 2005

(30) Foreign Application Priority Data

May 21, 2004    (KR) .................. 10-2004-0036411

(51) Int. Cl.
*H01L 21/302*    (2006.01)
*H01L 21/461*    (2006.01)

(52) U.S. Cl. .................. 438/724; 438/637; 438/700
(58) Field of Classification Search .............. 438/724
See application file for complete search history.

(56) References Cited

U.S. PATENT DOCUMENTS 6,316,349 B1 * 11/2001 Kim et al. .............. 438/637
6,803,318 B1 * 10/2004 Qiao et al. .............. 438/700

* cited by examiner

*Primary Examiner*—W. David Coleman
*Assistant Examiner*—Nicholas J Tobergte
(74) *Attorney, Agent, or Firm*—Heller Ehrman LLP

(57) ABSTRACT

The present invention discloses a method for fabricating a semiconductor device wherein precursor and deposition conditions of a bit line hard mask nitride film and a spacer nitride film are varied so that the nitride films are formed to have different etching ratios for sufficient protection of the bit line during an SAC process.

3 Claims, 3 Drawing Sheets

METHOD FOR FABRICATING A SEMICONDUCTOR DEVICE

BACKGROUND OF THE INVENTION

1. Field of the Invention

The present invention generally relates to a method for fabricating semiconductor devices, and more specifically, to a method for fabricating a semiconductor device wherein precursor and deposition conditions of a bit line hard mask nitride film and a spacer nitride film are varied so that the nitride films are formed to have different etching ratios.

2. Description of the Related Art

FIG. 1 is a cross-sectional view illustrating a conventional method for fabricating a semiconductor device.

Referring to FIG. 1, a predetermined lower structure (not shown) is formed on a semiconductor substrate 10. Thereafter, a planarized interlayer insulating film (not shown) is formed on an entire surface of the resulting structure. A conductive layer (not shown) for a bit line is then formed on the semiconductor substrate 10. Next, a hard mask nitride film (not shown) is formed on the conductive layer. Thereafter, the hard mask nitride film and the conductive layer are patterned to form a stacked structure including a bit line 20 and a hard mask pattern 30. A spacer nitride film is then formed on the entire surface of the semiconductor substrate 10. Thereafter, the spacer nitride film is etched using a fluorine base gas to form a nitride spacer 50 on a sidewall of the stacked structure.

Next, an interlayer insulating film is formed on the entire surface of the semiconductor substrate 10 including the bit line 20. A storage node contact plug (not shown) for connecting a capacitor is then formed. In this case, an undesirable contact between the bit line 20 and the storage node contact plug may occur. In order to solve such a problem, an SAC (Self Align Contact) process having a high selectivity over the nitride film is performed while the bit line 20 is capped using the hard mask pattern 20 on the bit line nitride spacer 50 and the bit line 20, thereby forming the storage node contact plug. However, the hard mask pattern 30 and the nitride spacer 50 are over-etched to expose the bit line 20. As a result, an SAC process margin for forming the storage node contact plug is decreased and a possibility of the SAC process failure is increased.

SUMMARY OF THE INVENTION

Accordingly, it is an object of the present invention to provide a method for fabricating a semiconductor device wherein precursor and deposition conditions of a bit line hard mask nitride film and a spacer nitride film are varied so that the nitride films are formed to have different etching ratios thereby improving a process margin of an SAC process and decrease the possibility of the SAC process failure.

In order to achieve the above object according to an embodiment of the present invention, there is provided a method for fabricating semiconductor devices. The method comprises the steps of: forming a conductive layer on a semiconductor substrate; forming a hard mask nitride film on the conductive layer via a first PE-CVD process using a mixture gas including $SiH_4$ and $NH_3/N_2$; patterning the hard mask nitride film and the conductive layer to form a bit line; forming a spacer nitride film on an entire surface of the semiconductor substrate via a second PE-CVD process using a mixture gas including dichlorosilane (hereinafter referred to as "DCS") and $NH_3/N_2$; and etching the spacer nitride film using a fluorine base gas to form a nitride spacer on a sidewall of the bit line.

BRIEF DESCRIPTION OF THE DRAWINGS

Other aspects and advantages of the present invention will become apparent upon reading the following detailed description and upon reference to the drawings in which.

DETAILED DESCRIPTION OF THE EXEMPLARY EMBODIMENTS

Figure 1:
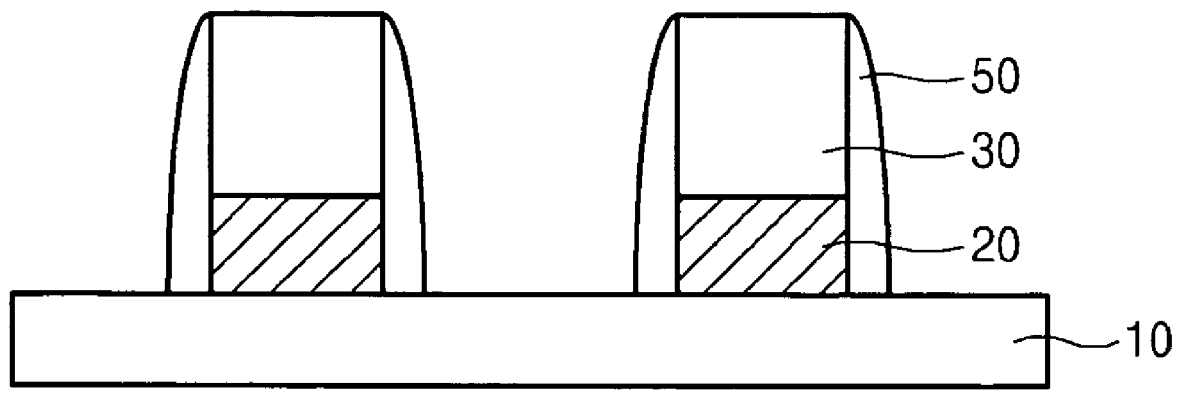
FIG. 1 is a cross-sectional view illustrating a conventional method for fabricating a semiconductor device.

A method for fabricating a semiconductor device in accordance with an embodiment of the present invention will be described in detail with reference to the accompanying drawings. Wherever possible, the same reference numerals will be used throughout the drawings to refer to the same or like parts.

FIGS. 2a through 2d are cross-sectional views illustrating a method for fabricating a semiconductor device according to the present invention.

Figure 2A:
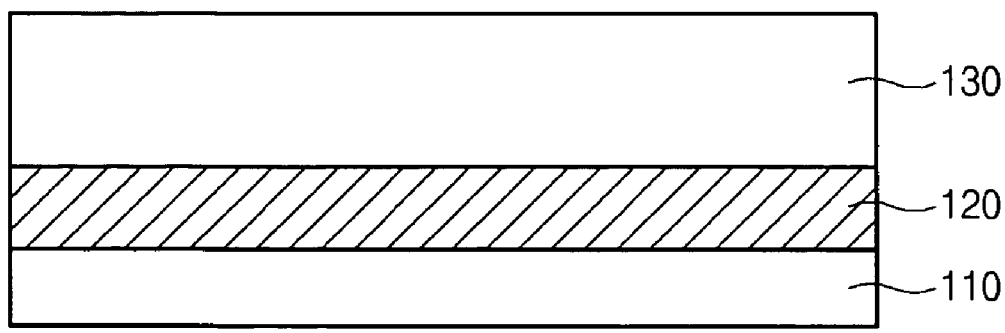
FIGS. 2a through 2d are cross-sectional views illustrating a method for fabricating a semiconductor device according to the present invention.

Referring to FIG. 2a, a conductive layer 120 for a bit line is formed on a semiconductor substrate 110. A hard mask nitride film 130 is then formed on the conductive layer 120. Preferably, the hard mask nitride film 130 is formed via a first PE-CVD process using a mixture gas containing $NH_3/N_2$ gas and $SiH_4$ gas as a base. Preferably, the first PE-CVD process is performed in a reactor under a pressure ranging from 5 Torr to 7 Torr at a temperature ranging from 500° C. to 600° C. by applying a RF power ranging from 0.40 kW to 0.43 kW.

Figure 2B:
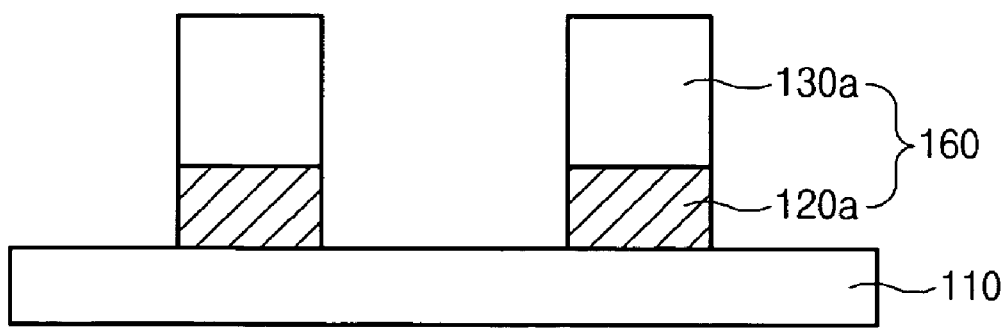

Referring to FIG. 2b, the hard mask nitride film 130 for the hard mask and the conductive layer 120 are patterned to form a stacked structure 160 including the bit line 120a and a hard mask pattern 130a.

Figure 2C:
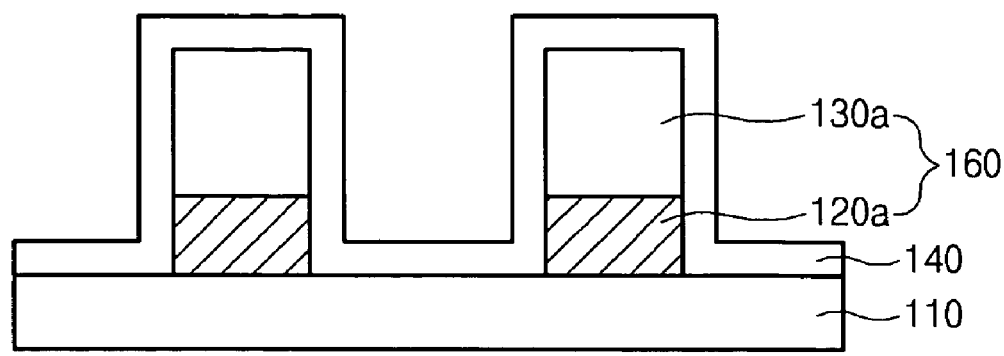

Referring to FIG. 2c, a spacer nitride film 140 is formed on an entire surface of the semiconductor substrate 110 by performing a second PE-CVD process using a mixture gas containing $NH_3/N_2$ and DCS gas as a base. Preferably, the spacer nitride film 140 is formed in a reactor under a pressure ranging from 0.30 Torr to 0.35 Torr at a temperature ranging from 600° C. to 750° C. by applying a RF power ranging from 0.40 kW to 0.43 kW.

Figure 2D:
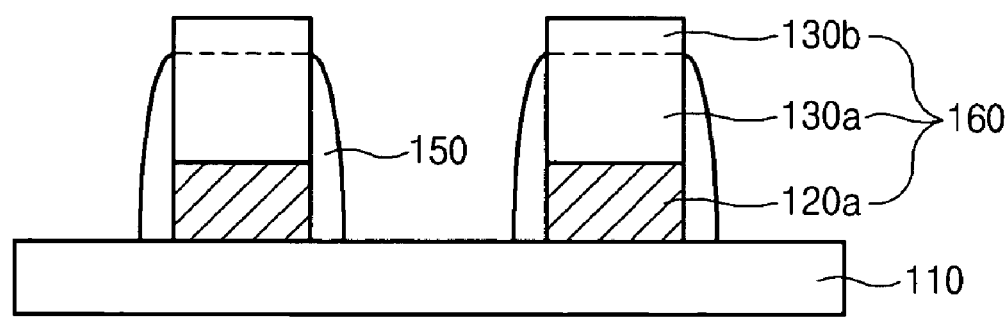

Referring to FIG. 2d, the spacer nitride film 140 is etched using a fluorine base gas to form the nitride film spacer 150 on a sidewall of the stacked structure 160.

The hard mask pattern 130a and the spacer nitride film 140 have different etching rates and compositions depending on their deposition materials and conditions. When the etching process is performed under an medium pressure using a fluorine base gas, the etch rate of the nitride spacer 150 is higher than that of the hard mask pattern 130a. Therefore a top portion 130b of the hard mask pattern 130a is maintained without any loss, and the top portion 130b of the hard mask pattern 130a provides sufficient thickness to prevent the loss of the nitride film spacer 150 and the bit line 120a during the SAC process.

As described above, in accordance with a method for fabricating semiconductor devices of the present invention, precursor and deposition conditions of a nitride film for the hard mask and a nitride spacer are varied to provide a hard mask nitride film of a bit line pattern with a sufficient thickness during an SAC process, thereby improving the SAC process margin and reducing the SAC process failure rate to improve a yield.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. Thus, the embodiments were chosen and described in order to explain the principles of the invention and its practical application to enable one skill in the art to utilize the invention in various embodiments and with various modifications as are suited to the particular use contemplated.

What is claimed is:

1. A method for fabricating a semiconductor device, comprising the steps of:

forming a conductive layer on a semiconductor substrate;

forming a hard mask nitride film on the conductive layer via a first PE-CVD process using a mixture gas including $SiH_4$ and $NH_3/N_2$;

patterning the hard mask nitride film and the conductive layer to form a bit line;

forming a spacer nitride film on an entire surface of the semiconductor substrate via a second PE-CVD process using a mixture gas including dichlorosilane and $NH_3/N_2$; and etching the spacer nitride film using a fluorine base gas to form a nitride spacer on a sidewall of the bit line, wherein the etching rate of the spacer nitride film by the fluorine base gas is higher than that of the hard mask nitride film so that the loss of the hard mask nitride film is minimized during the etching process for the spacer nitride film.

2. The method according to claim 1, wherein the first PE-CVD process is performed in a reactor under a pressure ranging from 5 Torr to 7 Torr at a temperature ranging from 500° C. to 600° C. by applying a RF power ranging from 0.40 kW to 0.43 kW.

3. The method according to claim 1, wherein the spacer nitride film is formed in a reactor under a pressure ranging from 0.30 Torr to 0.35 Torr at a temperature ranging from 600° C. to 750° C. by applying a RF power ranging from 0.40 kW to 0.43 kW.

* * * * *